US012009286B2

(12) United States Patent
Liew et al.

(10) Patent No.: US 12,009,286 B2
(45) Date of Patent: Jun. 11, 2024

(54) METHODS OF FORMING PACKAGED SEMICONDUCTOR DEVICES AND LEADFRAMES FOR SEMICONDUCTOR DEVICE PACKAGES

(71) Applicant: MACOM Technology Solutions Holdings, Inc., Lowell, MA (US)

(72) Inventors: Soon Lee Liew, Ipoh (MY); Eng Wah Woo, Ipoh (MY); Alexander Komposch, Morgan Hill, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 59 days.

(21) Appl. No.: 17/504,284

(22) Filed: Oct. 18, 2021

(65) Prior Publication Data

US 2023/0117260 A1    Apr. 20, 2023

(51) Int. Cl.
*H01L 23/495* (2006.01)
*H01L 23/31* (2006.01)
*H01L 23/48* (2006.01)

(52) U.S. Cl.
CPC .... *H01L 23/49541* (2013.01); *H01L 23/3178* (2013.01); *H01L 23/481* (2013.01)

(58) Field of Classification Search
CPC .................................. H01L 23/49541
USPC ........................... 257/678; 438/123
See application file for complete search history.

(56) References Cited

U.S. PATENT DOCUMENTS

2022/0115301 A1* 4/2022 Bowers .............. H01L 23/3185

FOREIGN PATENT DOCUMENTS

DE    102021113592 A1 * 12/2022

* cited by examiner

*Primary Examiner* — Ajay Arora
(74) *Attorney, Agent, or Firm* — Sage Patent Group

(57) ABSTRACT

A method of forming a packaged semiconductor device according to some embodiments includes providing a leadframe blank including a first package blank, a second package blank and a tie bar between the first package blank and the second package blank, forming a recessed cavity in the tie bar, and separating the first and second package blanks by sawing through the leadframe blank along the tie bar.

15 Claims, 7 Drawing Sheets

METHODS OF FORMING PACKAGED SEMICONDUCTOR DEVICES AND LEADFRAMES FOR SEMICONDUCTOR DEVICE PACKAGES

FIELD

The disclosure relates to packaging structures and methods for semiconductor devices.

BACKGROUND

Semiconductor devices are often used in systems that are exposed to a variety of harsh environmental conditions. For example, semiconductor devices may be exposed to extreme temperature ranges, humidity ranges, and/or other environmental conditions that may negatively impact the semiconductor devices. Moreover, semiconductor devices are often required to operate at or near their rated currents and voltages over extended periods of time. Operating in extreme environmental conditions and/or at elevated levels may lead to failure of the devices and/or deterioration in semiconductor device performance.

To protect semiconductor devices during operation and to provide for enhanced heat removal, the devices may be packaged in packages having various form factors. One example of a semiconductor device package is a no-lead package, such as a quad-flat no-lead (QFN) or dual-flat no-lead (DFN) package. Flat no-lead packages such as DFN and QFN are surface-mount packages that connect semiconductor chips to the surfaces of printed circuit boards (PCBs) without through-holes. Flat no-lead is a near chip scale technology that provides a plastic encapsulated package made with a planar copper lead frame substrate. Perimeter lands on the package bottom provide electrical connections to the PCB. Flat no-lead packages typically include an exposed thermally conductive pad to provide heat transfer away from the packaged semiconductor chip.

A DFN package may be manufactured by mounting the semiconductor device on a metal leadframe and encapsulating the semiconductor device with a protective material, such as plastic, to form a package that protects the semiconductor device during operation.

A conventional leadframe blank 10 is shown in FIG. 1A. The leadframe blank 10, which may be formed of copper (Cu), includes a plurality of package blanks 12 arranged in a matrix of rows and columns and connected by tie bars 20 that run between the package blanks 12. Each of the package blanks 12 includes a die attach pad 16 on which one or more semiconductor devices (not shown) may be mounted, along with a plurality of leads 14 that are separated from the die attach pad and attached to the tie bars 20. Exposed surfaces of the leads 14 form the lands on the package bottom that enable electrical connection to the PCB.

During a manufacturing process, semiconductor devices are mounted onto the die attach pads 16, and wire bonds are formed to connect bond pads on the semiconductor devices to leads 14 on the package blanks 12. A plurality of package bodies are then overmolded onto the package blanks 12. Individual semiconductor device packages are then singulated by sawing along the tie bars 20 to separate the packages.

FIG. 1B is a bottom view of a singulated semiconductor device package 50, and FIG. 1C is a cross-sectional view of the semiconductor device package 50 taken along line A-A' in FIG. 1B. As shown therein, the semiconductor device package 50 includes a die attach pad 16 on which a semiconductor device 25 is mounted. A plurality of metal leads 14 provide electrical connections for the package 50. A package body 30 is molded over the die attach pad 16, the leads 14 and the semiconductor device 25. The die attach pad 16 and/or the leads 14 may be formed with mold retention features 15, such a notches or ledges, to promote adhesion of the molding compound of the package body to the lead frame metal.

FIG. 1D is a top cross-sectional view of a package 70 including a leadframe 60 having a die attach pad 62 and leads 64, and FIG. 1E is a side cross-sectional view of the package 70 taken along line A-A' of FIG. 1D. As shown in FIG. 1D, the package 70 includes a top package body 72 and a bottom package body 74 that have been molded onto the leadframe 60. As seen in FIGS. 1D and 1E, the leadframe 60 includes locking holes 63 that extend through the leads 60. The mold compound used to form the top package body 72 and the bottom package body 74 fills the locking holes 63 to provide mechanical adhesion strength between the top package body 72 and the bottom package body 74.

Currently, DFN/QFN development is being carried out for multiple input multiple output (MIMO) power device packaging using larger package sizes, such as 6.5×7.0 and 7×10 mm. To achieve improved thermal performance and electrical characteristics for these packages, a power DFN package may use a thick lead-frame, e.g., 20 mils instead of the typical 8-10 mil thickness, and wider saw streets. With a thicker leadframe, saw singulation becomes a challenging process, because sawing through soft metals such as copper produces an increased level of mechanical stress at the contact between the metal and the saw blade. The increased mechanical stress may in turn increase the thermal stress on the package, particularly near the leads. Such increased stresses may cause delamination or separation between the mold compound used to form the package body and the leads. This is shown in FIG. 1F, which is an image of a package 50 generated by C-mode scanning acoustic microscopy after the sawing process. The image shown in FIG. 1F indicates high levels of stress near the leads 14.

Other features have been used that may help reduce the delamination between mold compound and the lead-frame, such as providing anchor interlocks on the leads embedded in the mold compound, providing U-grooves or V-grooves in the leads, etc. Such locking feature designs are applicable for packages which will use trim & singulation processes or leaded packages, but may not be suitable for QFN leadless packages, which are singulated using a sawing process due to package and design limitations.

SUMMARY

A method of forming a packaged semiconductor device according to some embodiments includes providing a leadframe blank including a first package blank, a second package blank and a tie bar between the first package blank and the second package blank. Each package blank includes a die attach pad and a lead, wherein the leads of the first and second package blanks are attached to the tie bar. The method further includes forming a recessed cavity in the tie bar and separating the first and second package blanks by sawing through the leadframe blank along the tie bar.

In some embodiments, forming the recessed cavity in the tie bar includes etching the tie bar, such as etching the tie bar at the attachment point to form the recessed cavity in the tie bar at the attachment point.

In some embodiments, etching the tie bar at the attachment point includes forming a mask on the leadframe blank, forming an opening in the mask above the attachment point, and isotropically etching the leadframe through the opening in the mask.

In some embodiments, the recessed cavity may be formed in the tie bar by stamping or punching the leadframe blank.

The method may further include molding first and second package bodies onto the first and second package blanks prior to separating the first and second package blanks.

In some embodiments, the method may further include mounting first and second semiconductor devices on the first and second die attach pads.

The leadframe blank may include a plurality of package blanks arranged in a two dimensional grid and connected to a plurality of tie bars arranged in saw streets between adjacent ones of the package blanks.

Each package blank may include a plurality of leads attached to the tie bar at respective attachment points, and the method may further include forming a plurality of recessed cavities in the tie bar at the attachment points.

In some embodiments, the recessed cavity is formed on a same side of the leadframe blank as die attach surfaces of the die attach pads. In some embodiments, the recessed cavity has a depth of about 25% to 75% of a thickness of the leadframe blank.

In some embodiments, the recessed cavity is formed in a top surface of the leadframe, the method further including forming a mold retention feature in a bottom surface of the leadframe opposite the top surface.

The recessed cavity may have an area greater than about 0.1 mm2 and/or a width greater than about 0.3 mm.

A method of forming a packaged semiconductor device according to some embodiments includes providing a leadframe blank including a first package blank, a second package blank and a tie bar between the first package blank and the second package blank, forming a recessed cavity in the tie bar, and separating the first and second package blanks by sawing through the leadframe blank along the tie bar.

A leadframe blank according to some embodiments includes a first package blank, a second package blank and a tie bar between the first package blank and the second package blank. The tie bar includes a recessed cavity therein.

Each package blank may include a die attach pad and a lead, and the leads of the first and second package blanks may be attached to the tie bar at an attachment point. The recessed cavity may be formed in the tie bar at the attachment point.

In some embodiments, each package blank includes a plurality of leads attached to the tie bar at respective attachment points, and the leadframe blank further includes recessed cavities in the tie bar at each of the attachment points.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1A:
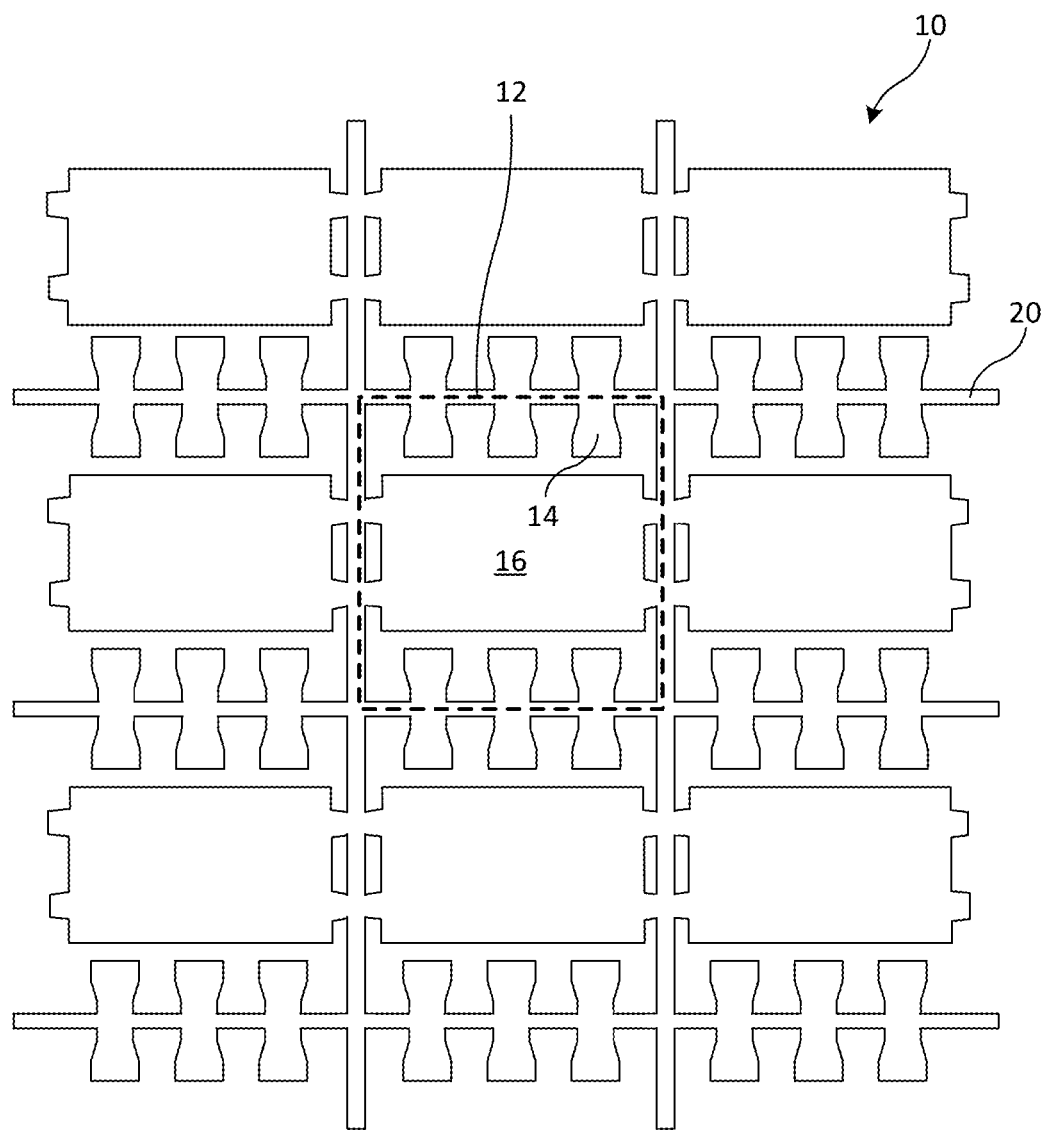
FIGS. 1A to 1F illustrate conventional package structures.
Figure 1B:
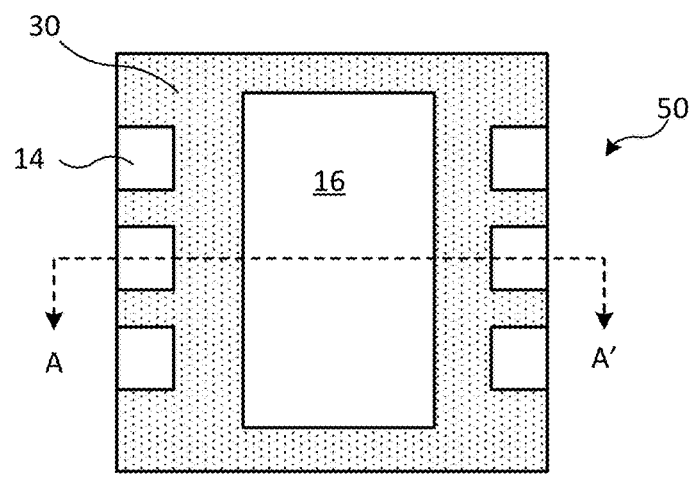
Figure 1C:
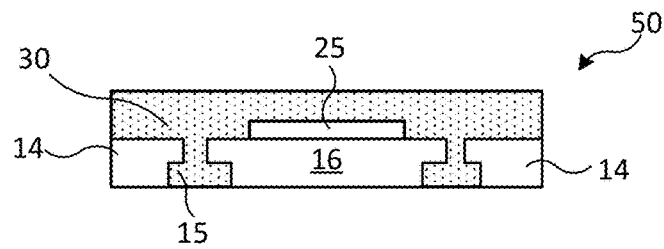
Figure 1D:
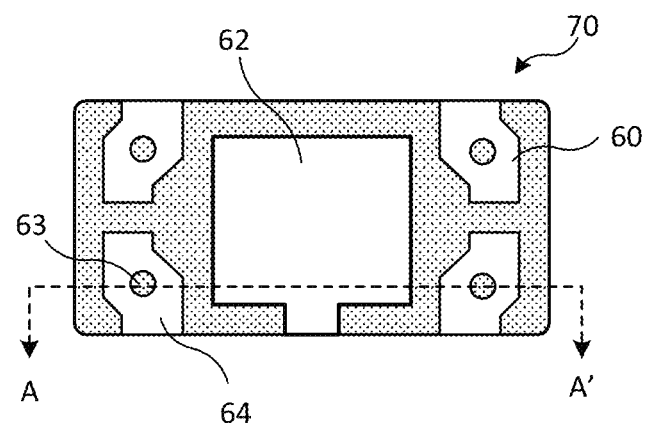
Figure 1E:
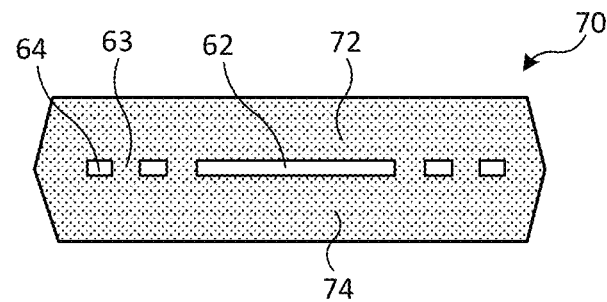
Figure 1F:
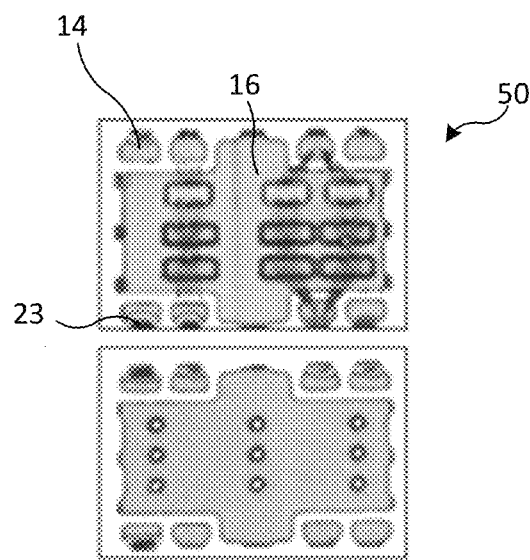

Embodiments of the inventive concepts are explained more fully with reference to the non-limiting aspects and examples that are described and/or illustrated in the accompanying drawings and detailed in the following description. It should be noted that the features illustrated in the drawings are not necessarily drawn to scale, and features of some embodiments may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As described above, DFN/QFN packages for high power applications may use leadframes having a thickness greater than 10 mils, such as 20 mils. Such packages may also have wider saw streets (i.e., the space between package blanks that a saw runs through during singulation). When thick leadframes and/or wide saw streets are used, singulating the packages using a sawing process may produce an increased level of mechanical and/or thermal stress at the contact between the metal and the saw blade. The increased stress may cause delamination or separation between the mold compound used to form the package body and the leads of the package.

Typical DFN/QFN leadless products have either bottom or top half etched designs which allows for narrow saw streets and thinner lead-frame (e.g., less than 10 mils thickness) which has less metal content in the saw street which results in low stress or reduced delamination after the sawing process. However, top or bottom half etch designs may not be suitable for power DFN packages having wider saw streets (e.g., 0.55 mm) and/or thicker leadframes (e.g., greater than 10 mils).

Accordingly, some embodiments provide methods and structures that can reduce mechanical and/or thermal stress imparted to a package during a sawing process to singulate the packages. In particular, in some embodiments, one or more recessed cavities are formed in the tie bars of a leadframe blank. Forming the recessed cavities in the tie bars of the leadframe blank may reduce the amount of metal that is removed during a sawing operation, which may reduce a level of mechanical and/or thermal stress imparted to the package during singulation. In particular embodiments, the recessed cavities may be formed at or near attachment points where the leads are attached to the tie bars to reduce stress imparted to the leads during the sawing operation.

Figure 2:
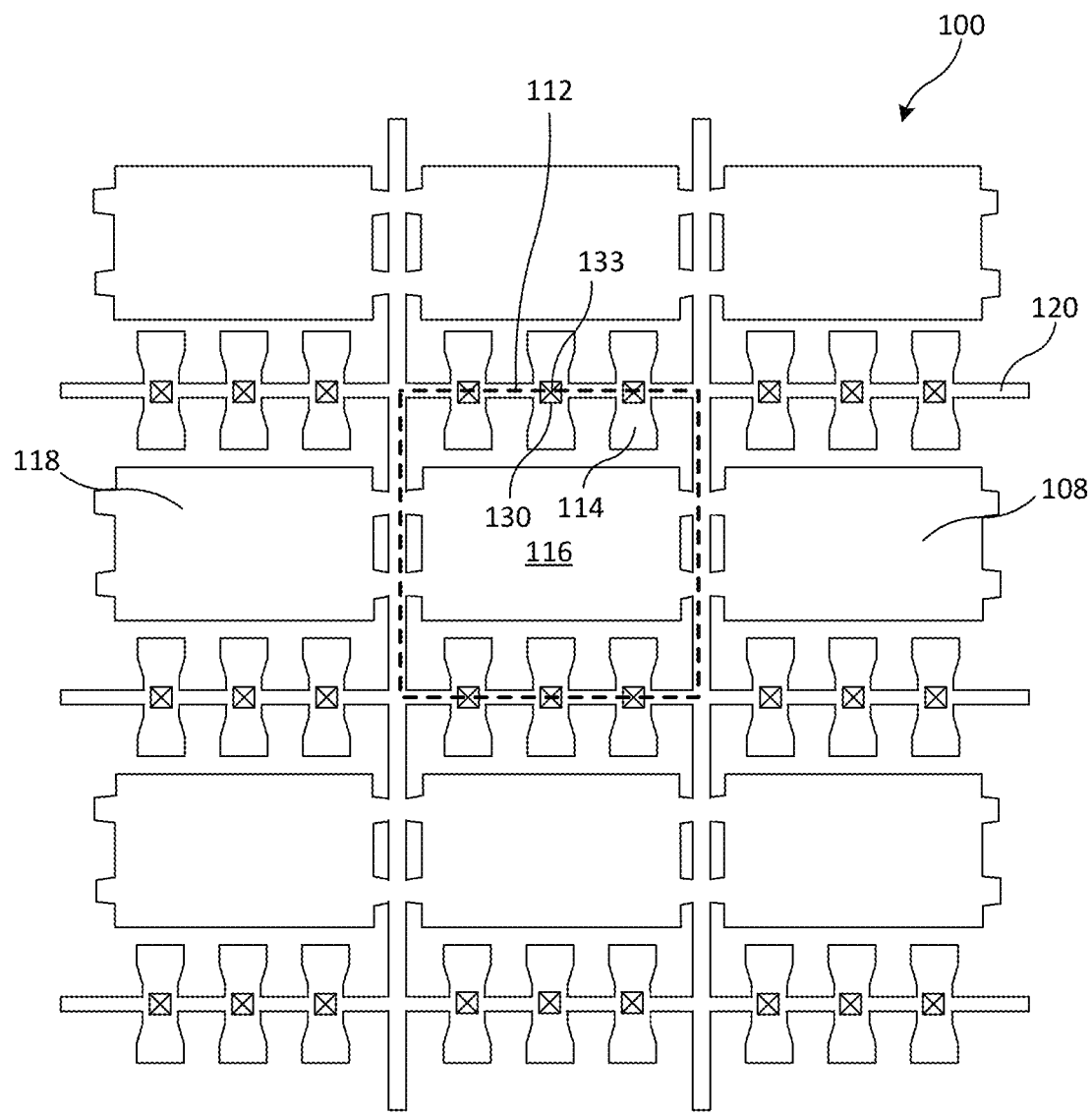
FIG. 2 is a top view of a leadframe blank according to some embodiments.

A leadframe blank 100 according to some embodiments is shown in FIG. 2. The leadframe blank 100, which may be formed of copper (Cu), includes a plurality of package blanks 112 arranged in a matrix of rows and columns and connected by tie bars 120 that run between the package blanks 112. Each of the package blanks 112 includes a die attach pad 116 on which one or more semiconductor devices (not shown) may be mounted, along with a plurality of leads 114 that are separated from the die attach pad and attached to the tie bars 120. Exposed surfaces of the leads 114 form the lands on the package bottom that enable electrical connection to the PCB.

During a manufacturing process, semiconductor devices are mounted onto a die attach surface 118 of the die attach pads 116 on a top or upper side 108 of the leadframe blank 100, and wire bonds are formed to connect bond pads on the semiconductor devices to leads 114 on the package blanks 112. A plurality of package bodies are then overmolded onto the package blanks 112. Individual semiconductor device packages are then singulated by sawing along the tie bars 120 to separate the packages.

As shown in FIG. 2, a plurality of recessed cavities 130 are formed in the tie bars 120. The recessed cavities 130 may be formed in the top or upper side 108 of the leadframe blank 100. That is, the plurality of recessed cavities 130 may be formed in the same side of the leadframe blank 100 as the die attach surface 118 of the die attach pads 116. The recessed cavities 130 may have a depth of about 25% to 75% of a thickness of the leadframe blank 100, and in particular embodiments may have a depth of about 50% of a thickness of the leadframe blank 100. Thus, for a leadframe blank 100 having a thickness of 20 mils, the recessed cavities 130 may have a depth of about 10 mils. In some embodiments, the recessed cavities 130 may extend completely through the leadframe blank 100 to form holes therethrough.

The recessed cavities 130 may have an area at the openings thereof of greater than about 0.1 mm$^2$, and in particular embodiments greater than about 0.3 mm$^2$. In the embodiments illustrated in FIG. 2, the recessed cavities 130 have a shape at the openings thereof that is square. However, it will be appreciated that the recessed cavities 130 may have any desired shape at the openings thereof, such as circular, oval, semi-circular, cross-shaped, etc.

As further shown in FIG. 2, the recessed cavities 130 may be formed at or near attachment points 133 where the leads 114 are attached to the tie bars 120. Thus, for example, two leads 114 on adjacent package blanks 112 may attach to a tie bar 120 at an attachment point 133. Because the leads 114 may have a width that is greater than the width of the tie bar 120, placing a recessed cavity 130 at the attachment point 133 between two leads 114 may allow the recessed cavity 130 to have an area that is greater than would otherwise be possible if placed elsewhere on the tie bar. Moreover, removing metal from the tie bar 120 in or near the attachment point 133 may contribute to a reduction of stresses imparted to the package near the leads 114 during a sawing process.

The recessed cavities 130 may be formed in the leadframe blank 100 by etching, stamping and/or punching. In particular, the recessed cavities may be formed using an isotropic copper etching process, such as aqueous copper etching processes known in the art, by forming a mask on the upper surface 108 of the leadframe blank 100 having openings therein above the attachment points 133 and etching the metal of the leadframe blank 100 through the openings in the mask.

Figure 3A:
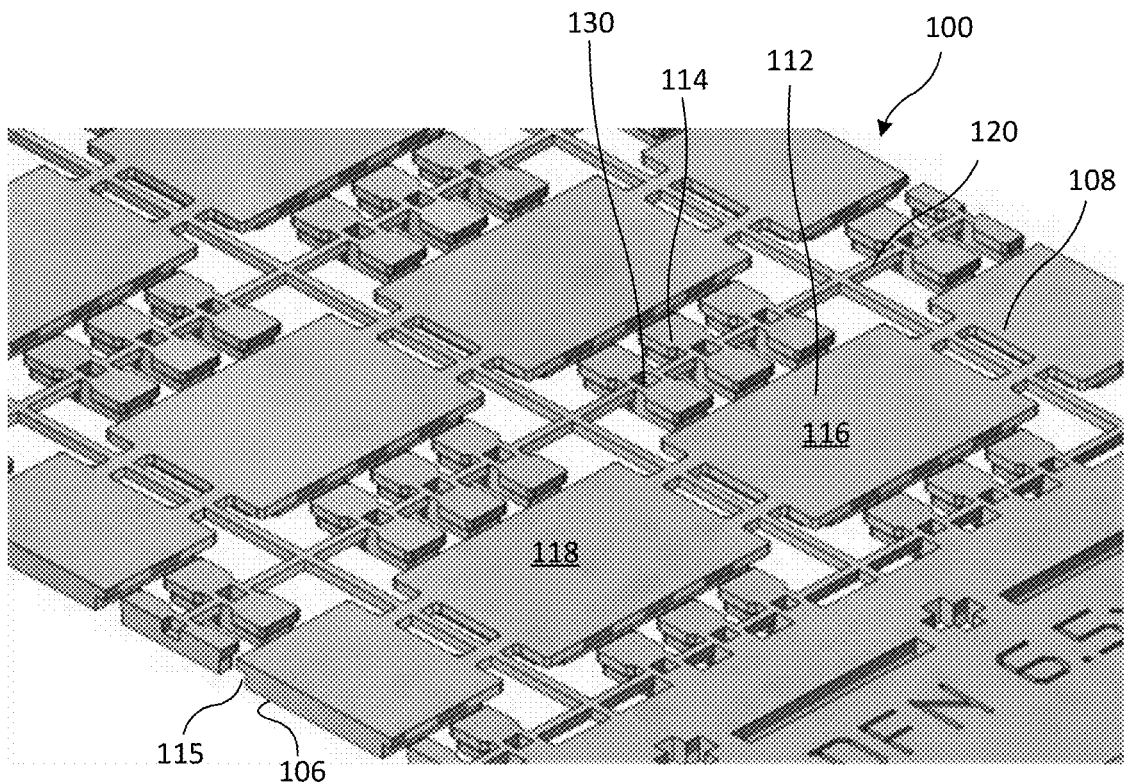
FIGS. 3A and 3B are perspective views of a leadframe blank according to some embodiments.
Figure 3B:
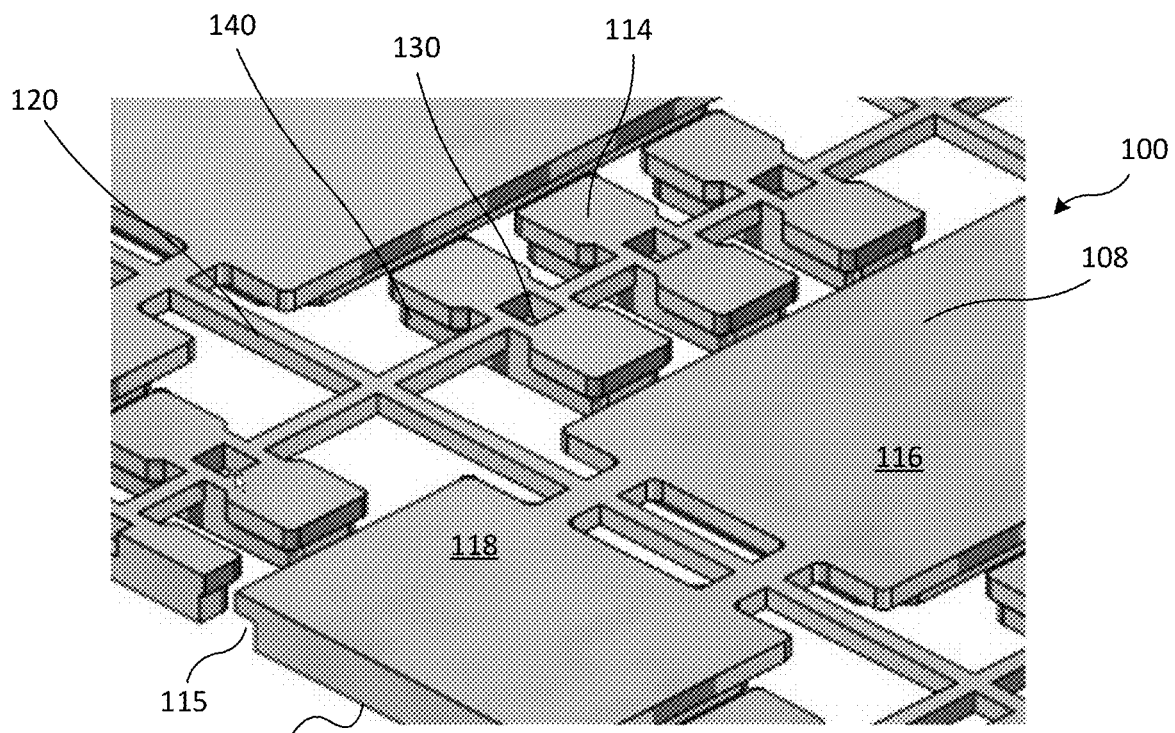

FIGS. 3A and 3B are perspective views of a leadframe blank 100 showing additional features of the leadframe blank 100. In particular, FIGS. 3A and 3B illustrate a leadframe blank 100 including a plurality of package blanks 112 arranged in a matrix of rows and columns and connected by tie bars 120 that run between the package blanks 112. Each of the package blanks 112 includes a die attach pad 116 along with a plurality of leads 114 that are separated from the die attach pad and attached to the tie bars 120. A plurality of recessed cavities 130 are formed in the tie bars 120 in the upper side 108 of the leadframe blank 100, i.e., in the same side of the leadframe blank 100 as the die attach surface 118 of the die attach pads 116.

As can be seen in FIGS. 3A and 3B, the die attach pads 112 and leads 114 may also be etched from the bottom side 106 opposite the top side 108 to form mold retention features 115 to promote adhesion of the molding compound of the package body to the lead frame metal. In some embodiments, one or more of the recessed cavities 130 may be formed in the opposite side 106 of the leadframe blank 100. For example, one or more of the recessed cavities 130 may be formed in a same etching procedure as the mold retention features 115 are formed.

Figure 4A:
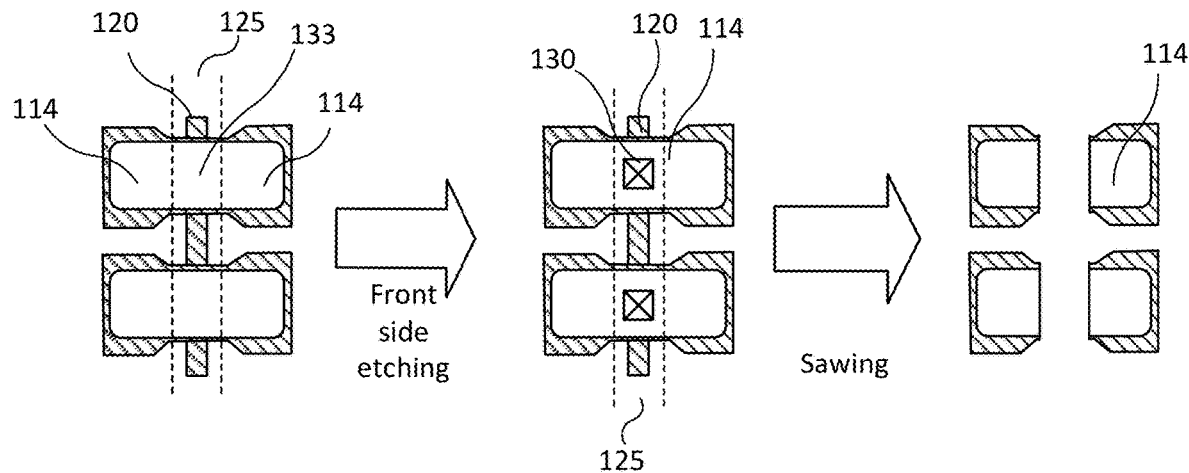
FIG. 4A illustrates operations of forming recessed cavities in a leadframe blank according to some embodiments.

In some embodiments, the mold retention features 115 may be formed in a half-etch process that etches half of the thickness from the bottom of the leadframe blank 100. This is illustrated in FIG. 4A, which shows a pair of leads 114 connected to a tie bar 120 at an attachment point 133. A saw street 125 is shown to indicate the path that a dicing saw will follow when singulating the packages. As shown in FIG. 4, the saw street 125 is wider than the tie bar 120, which means that the entire tie bar 120 will be removed as part of the sawing/dicing process. Cross-hatched regions of the leads 114 indicate portions of the leads where the bottom or back sides have been etched in a back side etch process.

FIG. 4A further illustrates that recessed cavities 130 are formed at the attachment points 133 in a front side etching process. Because the recessed cavities 130 are formed at the attachment points 133, the recessed cavities 130 may be wider than the tie bar 120. However, in some embodiments, the recessed cavities 130 may have the same width or a smaller width than the tie bar 120.

Still referring to FIG. 4A, after a sawing process, the tie bar 120 is removed as the adjacent packages are separated. In the embodiments shown in FIG. 4A, the recessed cavities 130 are formed entirely within the saw street 125, and thus the recessed cavities 130 are entirely removed in the sawing process as well. However, in some embodiments, some portions of the recessed cavities 130 may be formed outside the saw street 125, and thus may remain in the structure after the sawing process.

Figure 4B:
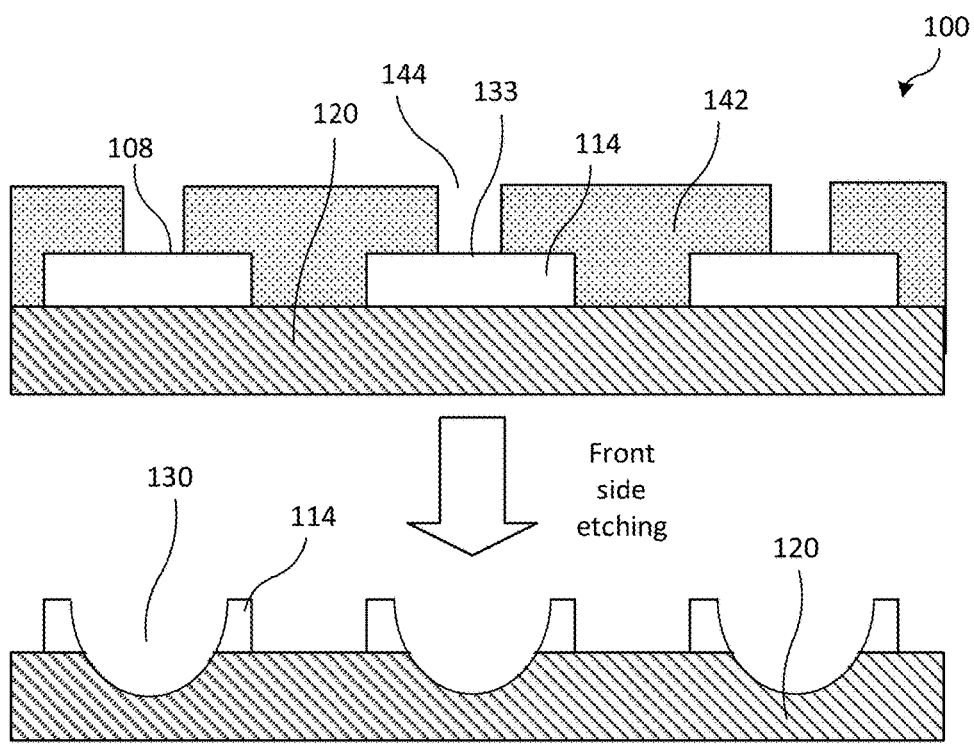
FIG. 4B illustrates an etching process for forming recessed cavities in a leadframe blank according to some embodiments.

FIG. 4B illustrates an etching process for forming the recessed cavities 130. In particular, FIG. 4B is a cross-sectional view of a portion of a leadframe blank 100 through one of the tie bars 20. An etch mask 142 is formed on an upper surface 108 of the leadframe blank 100, and openings 144 are formed in the etch mask above the attachment points 133 at which leads 114 attach to the tie bar 120. An aqueous copper etchant is exposed to the resulting structure, and the etchant isotropically etches the exposed portions of the leadframe blank 100 within the openings 144 to form recessed cavities 130. The etch mask 142 is then removed. Because the aqueous copper etch is isotropic, the resulting cavities 130 may have a generally semicircular profile as shown in FIG. 4B. However, the shape of the cavities 130 may differ depending on the type of etch used, the etchant, and the etch parameters, such as etch time and etch temperature. Aqueous etching of copper is well known in the art.

Figure 5:
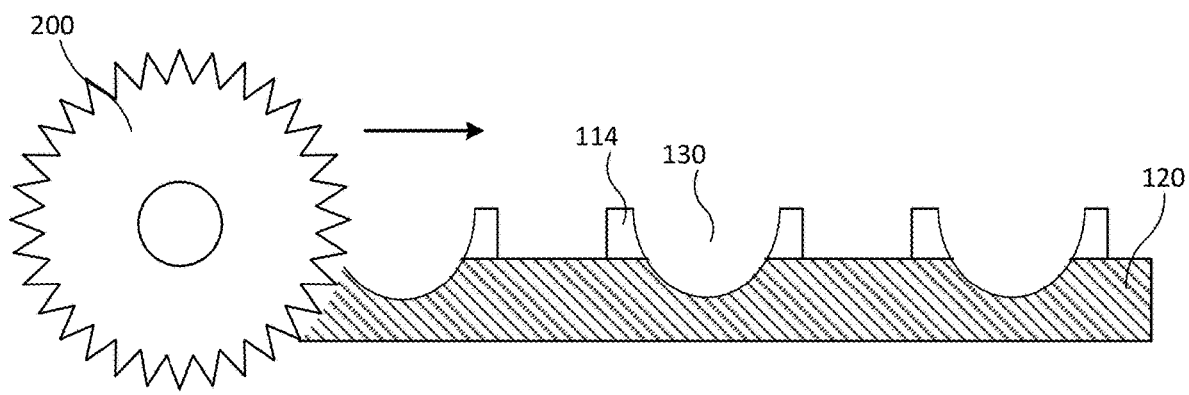
FIG. 5 is a side cross sectional view along a tie bar of a leadframe blank according to some embodiments showing a sawing process.

FIG. 5 is a side cross sectional view along a tie bar 120 of a leadframe blank 100 showing the sawing process. As shown in FIG. 5, a circular saw 200 may saw the leadframe blank 100 along the tie bar 120 to separate adjacent packages. Because of the presence of the recessed cavities 130, the circular saw 200 may be required to remove less metal during the sawing process, which may reduce both thermal and/or mechanical stress applied to the package in the sawing process, particularly in the area around the leads 114.

Figure 6:
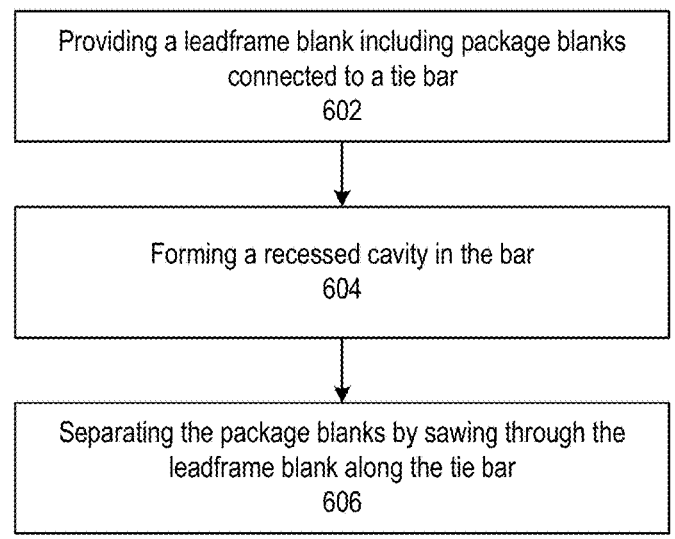
FIG. 6 is a flowchart that illustrates a method of forming a packaged semiconductor device according to some embodiments.

FIG. 6 is a flowchart that illustrates a method of forming a packaged semiconductor device according to some embodiments. Referring to FIG. 6, the method includes providing a leadframe blank including a first package blank, a second package blank and a tie bar between the first package blank and the second package blank (block 602). Each package blank includes a die attach pad and a lead attached to the tie bar. The method further includes forming a recessed cavity in the tie bar (block 604), and separating the first and second package blanks by sawing through the leadframe blank along the tie bar (block 606).

The recessed cavity may be formed in the tie bar by etching the tie bar. In particular, etching the tie bar may include etching the tie bar at the attachment point to form the recessed cavity in the tie bar at the attachment point. In some embodiments, etching the tie bar at the attachment point includes forming a mask on the leadframe blank, forming an opening in the mask above the attachment point, and isotropically etching the leadframe through the opening in the mask.

In Some Embodiments, the Recessed Cavity May be Formed in the Tie Bar by Stamping or Punching the Leadframe Blank.

The method may further include molding first and second package bodies onto the first and second package blanks prior to separating the first and second package blanks. The method may further include mounting first and second semiconductor devices on the first and second die attach pads.

In some embodiments, the leadframe blank comprises a plurality of package blanks arranged in a two dimensional grid and connected to a plurality of tie bars arranged in saw streets between adjacent ones of the package blanks.

Each package blank may include a plurality of leads attached to the tie bar at respective attachment points, and the method may further include forming a plurality of recessed cavities in the tie bar at the attachment points.

The recessed cavity may be formed on a same side of the leadframe blank as die attach surfaces of the die attach pads or on the opposite side of the leadframe as the die attach surfaces.

The recessed cavity may have a depth of about 25% to 75% of a thickness of the leadframe blank. The recessed cavity may have an area greater than about 0.1 mm$^2$. In some embodiments, the recessed cavity has a width greater than about 0.3 mm.

A packaged transistor device that is formed according to some embodiments may be utilized in power semiconductor devices and/or applications. In some embodiments, the power semiconductor devices may be utilized for a power module that may include structure optimized for state-of-the-art wide band gap power semiconductor devices such as Gallium Nitride (GaN), Silicon Carbide (SiC), and the like, which are capable of carrying high amounts of currents and voltages and switching at increasingly faster speeds in comparison with established technologies. The power devices may include Wide Band Gap (WBG) semiconductors, including Gallium Nitride (GaN), Silicon Carbide (SiC), and the like, and offer numerous advantages over conventional Silicon (Si) as a material for the power devices.

Nevertheless, various aspects of the disclosure may utilize Si type power devices and achieve a number of the benefits described herein.

A transistor device according to some embodiments may be utilized in radio frequency (RF) applications. In particular, a transistor device according to some embodiments may be utilized in wireless base stations that connect to a wireless device. In further aspects, the transistor device may be utilized in in wireless communication devices.

In aspects, the dimensions of z and/or d may be critical in order to address extreme temperature ranges, humidity ranges, and/or a host of other environmental conditions; operation at or near rated currents and voltages over extended periods of time; and address manufacturing issues such as insufficiently optimized wire bonding processes as well as others.

The invention claimed is:

1. A method of forming a packaged semiconductor device, comprising:
    providing a leadframe blank including a first package blank, a second package blank and a tie bar between the first package blank and the second package blank, each package blank comprising a die attach pad and a lead, wherein the leads of the first and second package blanks are attached to the tie bar;
    forming a recessed cavity in the tie bar; and
    separating the first and second package blanks along the tie bar,
    wherein each package blank comprises a plurality of leads attached to the tie bar at respective attachment points, the method further comprising forming a plurality of recessed cavities in the tie bar at the attachment points.

2. The method of claim 1, wherein forming the recessed cavity in the tie bar comprises etching the tie bar.

3. The method of claim 2, wherein etching the tie bar comprises etching the tie bar at the attachment point to form the recessed cavity in the tie bar at the attachment point.

4. The method of claim 2, wherein etching the tie bar at the attachment point comprises:
    forming a mask on the leadframe blank;
    forming an opening in the mask above the attachment point; and
    isotropically etching the leadframe through the opening in the mask.

5. The method of claim 1, wherein forming the recessed cavity in the tie bar comprises stamping or punching the leadframe blank.

6. The method of claim 1, further comprising:
    molding first and second package bodies onto the first and second package blanks prior to separating the first and second package blanks.

7. The method of claim 1, further comprising:
    mounting first and second semiconductor devices on the first and second die attach pads.

8. The method of claim 1, wherein the leadframe blank comprises a plurality of package blanks arranged in a two dimensional grid and connected to a plurality of tie bars arranged in saw streets between adjacent ones of the package blanks.

9. The method of claim 1, wherein the recessed cavity is formed on a same side of the leadframe blank as die attach surfaces of the die attach pads.

10. The method of claim 1, wherein the recessed cavity has a depth of about 25% to 75% of a thickness of the leadframe blank.

11. The method of claim 1, wherein the recessed cavity is formed in a top surface of the leadframe, the method further comprising forming a mold retention feature in a bottom surface of the leadframe opposite the top surface.

12. The method of claim 1, wherein the recessed cavity has an area greater than about 0.1 mm$^2$.

13. The method of claim 1, wherein the recessed cavity has a width greater than about 0.3 mm.

14. A method of forming a packaged semiconductor device, comprising:
    providing a leadframe blank including a first package blank, a second package blank and a tie bar between the first package blank and the second package blank;
    forming a recessed cavity in the tie bar; and
    separating the first and second package blanks along the tie bar,
    wherein separating the first and second package blanks along the tie bar comprises sawing through the leadframe blank along the tie bar.

15. The method of claim 1, wherein separating the first and second package blanks along the tie bar comprises sawing through the leadframe blank along the tie bar.

* * * * *